United States Patent
Lee

(10) Patent No.: US 8,169,258 B2
(45) Date of Patent: May 1, 2012

(54) SEMICONDUCTOR INTEGRATED CIRCUIT

(75) Inventor: Dong Uk Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 49 days.

(21) Appl. No.: 12/648,353

(22) Filed: Dec. 29, 2009

(65) Prior Publication Data

US 2010/0327962 A1    Dec. 30, 2010

(30) Foreign Application Priority Data

Jun. 29, 2009  (KR) .................. 10-2009-0058649

(51) Int. Cl.
*G05F 1/10* (2006.01)
*G05F 3/02* (2006.01)

(52) U.S. Cl. ........................................... 327/541

(58) Field of Classification Search .......... 327/538, 327/540, 541
See application file for complete search history.

(56) References Cited

U.S. PATENT DOCUMENTS

| 5,793,318 | A |   | 8/1998 | Jewett |         |
|-----------|---|---|--------|--------|---------|
| 6,018,560 | A | * | 1/2000 | Kim    | 377/123 |
| 6,570,402 | B2| * | 5/2003 | Koo et al. | 326/30 |
| 6,737,909 | B2| * | 5/2004 | Jaussi et al. | 327/541 |
| 7,285,977 | B2| * | 10/2007| Kim    | 326/30 |
| 7,800,432 | B2| * | 9/2010 | Kudo   | 327/538 |
| 2008/0036530 | A1| * | 2/2008 | Chang | 327/538 |
| 2009/0072893 | A1| * | 3/2009 | Hirota | 327/540 |

FOREIGN PATENT DOCUMENTS

| JP | 03-278742 A | 12/1991 |
| JP | 09-083363 A | 3/1997 |
| KR | 1020010055881 A | 7/2001 |
| KR | 100806608 B1 | 2/2008 |
| KR | 100845811 B1 | 7/2008 |

* cited by examiner

*Primary Examiner* — Quan Tra
(74) *Attorney, Agent, or Firm* — Ladas & Parry LLP

(57) ABSTRACT

A semiconductor integrated circuit includes a reference voltage generating block, a circuit block, and a transmission line. The reference voltage generating block generates a first reference voltage and generates and outputs a digital code corresponding to the level of the first reference voltage. The circuit block converts the digital code into a second reference voltage and uses the second reference voltage for operation related to the function of the semiconductor integrated circuit. The transmission line is connected between the reference voltage generating block and the circuit block to allow transmission of the digital code to the circuit block.

15 Claims, 7 Drawing Sheets

320

400

SEMICONDUCTOR INTEGRATED CIRCUIT

CROSS-REFERENCES TO RELATED PATENT APPLICATION

The present application claims priority under 35 U.S.C. 119(a) to Korean Application No. 10-2009-0058649, filed on Jun. 29, 2009, in the Korean Intellectual Property Office, which is incorporated herein by reference in its entirety as set forth in full.

BACKGROUND

1. Technical Field

An embodiment described herein relates generally to a semiconductor technology, and more particularly, to a semiconductor integrated circuit.

2. Related Art

A semiconductor integrated circuit requires a reference voltage for defining a reference for various operations. The reference voltage can be generated internally or provided externally.

Therefore, a semiconductor integrated circuit typically includes a circuit configuration for transmitting a reference voltage to circuit blocks that require the reference voltage.

The reference voltage is an analog signal and is transmitted to the circuit blocks through a transmission line.

It is highly likely that the level of the analog signal changes due to the influence of various noises occurring and caused during transmission of the analog signal through its transmission line. In other words, the level of the analog signal at the transmission side may differ from the level of the analog signal at the receiving side.

The reference voltage defines an operation reference of the circuit block to which it is input; and therefore, when the level of the reference voltage differs from the target level, the corresponding circuit block may malfunction thereby degrading the performance of operations carried out by the semiconductor integrated circuit.

Accurate transmission of a reference voltage in an analog signal type to the circuit blocks at the target level is necessary.

SUMMARY

Embodiments of the present invention provide a semiconductor integrated circuit in which the stability of operations of the semiconductor integrated circuit are improved by providing a reference voltage that is maintained at a target level regardless of noise.

In one embodiment a semiconductor integrated circuit includes: a reference voltage generating block that generates a first reference voltage and generates and outputs a digital code corresponding to a level of the first reference voltage; a circuit block that converts the digital code into a second reference voltage and uses the second reference voltage for the operation related to a function of the semiconductor integrated circuit; and a transmission line that is connected between the reference voltage generating block and the circuit block to transmit the digital code.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Hereinafter, preferred embodiments will be described in more detail with reference to the accompanying drawings.

An embodiment of the present invention maintains a reference voltage provided to circuit blocks at a target level regardless of noise. Embodiments are provided with respect to an analog transmission scheme and a digital transmission scheme.

First, embodiments according to an analog transmission scheme will be described with reference to the accompanying drawings.

Figure 1:
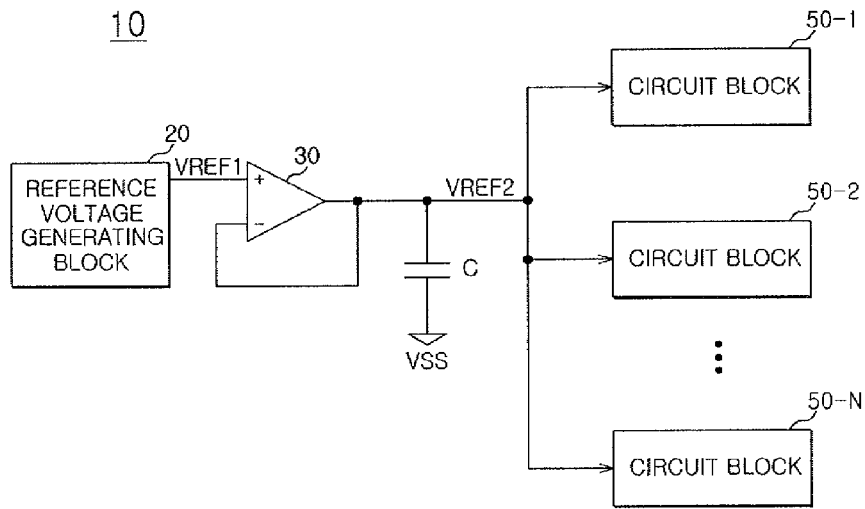
FIG. 1 is a block diagram showing a configuration of a semiconductor integrated circuit according to one embodiment.

FIG. 1 is a block diagram showing a configuration of a semiconductor integrated circuit 10 according to one embodiment.

Referring to FIG. 1, a semiconductor integrated circuit 10 according to an embodiment of the present invention includes a reference voltage generating block 20, a buffer 30, a decoupling capacitor 'C', and a plurality of circuit blocks 50-1 to 50-N.

A first reference voltage 'VREF1', which is generated in the reference voltage generating block 20, is input to the buffer 30.

The buffer 30 buffers the first reference voltage 'VREF1' to generate a second reference voltage 'VREF2' and transmits the second reference voltage 'VREF2' to the plurality of circuit blocks 50-1 to 50N.

The decoupling capacitor 'C' is connected to an output end of the buffer 30 and removes the noise of the second reference voltage 'VREF1', such that the level of the second reference voltage 'VREF2' does not differ from the target level.

Hereinafter, embodiments according to a digital scheme will be described with reference to the accompanying drawings.

Figure 2:
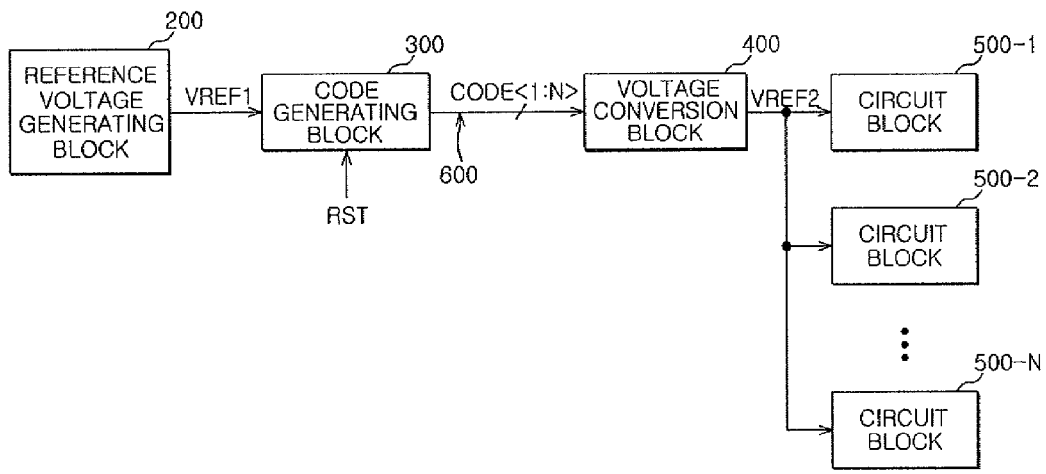
FIG. 2 is a block diagram of a semiconductor integrated circuit 100 according to another embodiment.

FIG. 2 is a block diagram of a semiconductor integrated circuit 100 according to another embodiment of the present invention.

The principle of the configuration of the embodiment shown in FIG. 2 is the conversion of an analog type reference voltage into a digital code type, transmitting the digital code type, and then restoring the reference voltage into a voltage having the same level as the original reference voltage and transmitting the restored voltage to the circuit blocks requiring it.

Referring to FIG. 2, a semiconductor integrated circuit 100 according to an embodiment of the present invention includes a reference voltage generating block 200, a code generating block 300, a voltage conversion block 400, a transmission line 600, and a plurality of circuit blocks 500-1 to 500-N.

The reference voltage generating block 200 is configured to generate the first reference voltage 'VREF1'. In an embodiment, the reference voltage generating block 200 may be implemented as a band gap reference circuit. The band gap reference circuit generates a reference voltage that will have a predetermined level regardless of fluctuation in process/voltage/temperature (PVT) by using the temperature/resistance change characteristics of a bipolar junction transistor (BJT).

The reference voltage generating block 200 may be included within the semiconductor integrated circuit 100 or in an external apparatus outside of the semiconductor integrated circuit.

The code generation block 300 receives a reset signal 'RST' and the first reference voltage 'VREF1' and is configured to generate a digital code "CODE<1:N>" corresponding to the first reference voltage 'VREF1'.

The voltage conversion block 400 is configured to generate a second reference voltage 'VREF2' using the digital code 'CODE<1:N>'. Using the digital code 'CODE<1:N>', The second reference voltage 'VREF2' can be generated to have the same level as the first reference voltage 'VREF1'. The voltage conversion block 400 then transmits the second reference voltage 'VREF2' to the plurality of circuit blocks 500-1 to 500-N.

Each of the plurality of circuit blocks 500-1 to 500-N has a function that is carried out using the second reference voltage 'VREF2'. In the case in which the semiconductor integrated circuit is semiconductor memory, which is used solely for the purpose of example, the respective circuit blocks 500-1 to 500-N would include different types of circuit components such as a buffer, a sense amplifier, a decoder, a delay fixed loop, etc., all of which use the reference voltage.

The transmission line 600 provides a connection between the code generating block 300 and the voltage conversion block 400 and facilitates transmission of the digital code 'CODE<1:N>'.

When using a transmission line to transmit an analog signal, the length of the transmission line affects the signal. For example, as the transmission line gets longer, the probability of fluctuation in the signal value due to signal attenuation, noise, etc is greater. Therefore, it is preferable that the analog type first reference voltage 'VREF1' is transmitted to the code generating block 300 through a short transmission line. Accordingly, it is preferable that the code generating block 300 be disposed adjacent to the reference voltage generating block 200.

In addition, it is preferable that the voltage conversion block 400 is disposed adjacent to the plurality of circuit blocks 500-1 to 500-N so that the second reference voltage 'VREF2', which is the signal obtained by converting the digital code 'CODE<1:N>' into an analog form, may be provided to the plurality of circuit blocks 500-1 to 500-N through the shortest possible transmission line.

Therefore, in an embodiment, the transmission line from the reference voltage generating block 200 to the code generating block 300 and the transmission line from the voltage conversion block 400 to the plurality of circuit blocks 500-1 to 500-N are formed to be shorter than the length of the transmission line 600 from the code generating block 300 to the voltage conversion block 400.

Meanwhile, relative to the analog signal, the digital code 'CODE<1:N>' is minimally affected by the occurrence of noise due over the length of the transmission line. Therefore, the transmission line 600 may be formed at a length passing through the entire area of the semiconductor integrated circuit, for example, at the length corresponding to a global input and output line 'GI0' that is formed up to the data input and output circuit in a memory core area of semiconductor memory.

In addition, in contrast to an analog signal, the digital code 'CODE<1:N>' is represented by logic values of 0 and 1. As such, the digital code can be accurately recognized at the receiving side, that is, the voltage conversion block 400, even though slight signal attenuation occurs during transmission. Accordingly, there is no need to configure a separate buffer or a repeater, etc., in the transmission line 600 in order to compensate for reduction in the level of the digital code 'CODE<1:N>'.

Figure 3:
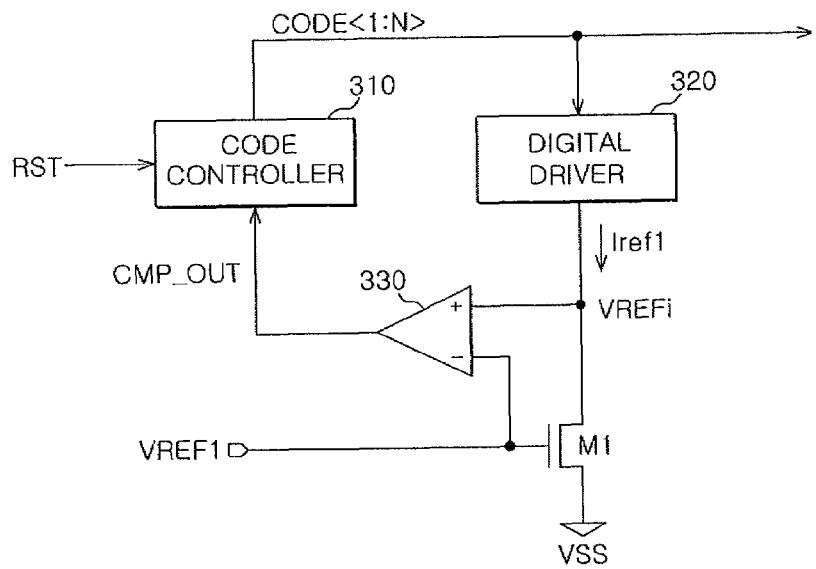
FIG. 3 is a block diagram showing the configuration of an embodiment of the code generating block of FIG. 2.

FIG. 3 is a block diagram showing a configuration of the code generating block 300 of FIG. 2.

The code generating block 300 is configured to repeatedly perform a comparison between a code conversion voltage 'VREFi' and the first reference voltage 'VREF1' at a defined period. The code conversion voltage 'VREFi' is generated using the digital code 'CODE<1:N>' during a setting time period. The code generating block 300 generates the code value of the digital code 'CODE<1:N>' using the comparison results. In an embodiment, the code value of the digital code 'CODE<1:N>' is set such that the level of the code conversion voltage 'VREFi' is equal to the level of the first reference voltage 'VREF1'.

In the embodiment shown in FIG. 3, the code generating block 300 is configured to include a code controller 310, a digital driver 320, a transistor 'M1' used as a potential difference generation element, and a comparator 330.

The code controller 310 is responsive to a reset signal 'RST' and increases or decreases the code value of the digital code 'CODE<1:N>' according to the comparison signal 'CMP_OUT' output as the comparison result between the reference voltage 'VREF1' and the code conversion voltage. The performance of the increasing and decreasing operations is performed for a set time.

The digital driver 320 is configured to control the amount of current 'Iref1' flowing to the transistor 'M1' used as the potential difference generating element. The amount of current output by the digital diver is dependent upon the code value of the digital code 'CODE<1:N>'.

The drain of the transistor 'M1' is connected to the digital driver 320, the gate thereof is applied with the first reference voltage 'VREF1', and the source thereof is connected to a ground end 'VSS', The code conversion voltage 'VREFi' corresponding to the current amount 'Iref1' controlled by the digital driver 320 is generated between the source and the drain of the transistor 'M1'.

The comparator 330 is configured to generate the comparison signal 'CMP_OUT' by comparing the code conversion voltage 'VREFi' to the first reference voltage 'VREF1'. For example, the comparator 330 outputs the comparison signal 'CMP_OUT' at a high level when the code conversion voltage 'VREFi' is higher than the first reference voltage 'VREF1', and outputs the comparison signal 'CMP_OUT' at a low level when the code conversion voltage 'VREFi' is lower than the first reference voltage 'VREF1'.

Figure 4:
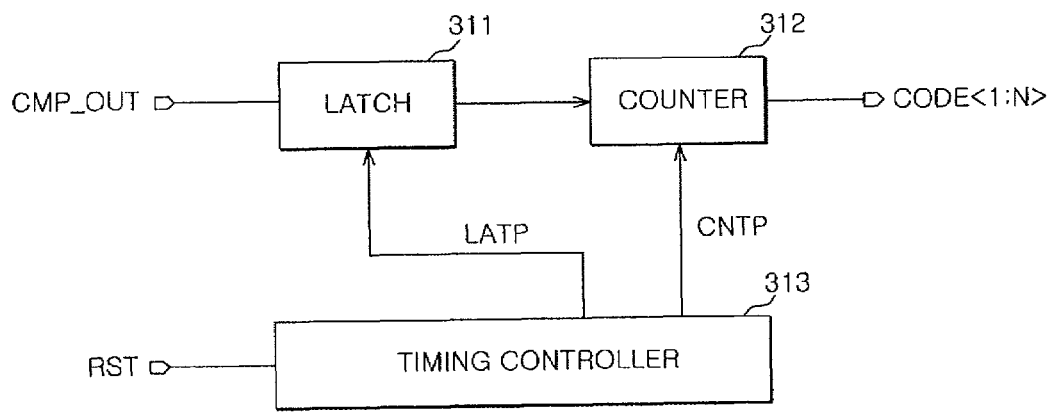
FIG. 4 is a block diagram showing the configuration of an embodiment of the code controller of FIG. 3.

FIG. 4 is a block diagram showing a configuration of an embodiment of the code controller 310 of FIG. 3.

In the embodiment shown in FIG. 4, the code controller 310 includes a latch 311, a counter 312, and a timing controller 313.

The latch 311 is configured to latch the comparison signal 'CMP_OUT' in response to a latch pulse 'LATP'.

The counter 312 is configured perform increasing and decreasing operations. The counter 312 increases or decreases the code value of the digital code 'CODE<1:N>' according to the output of the latch 311 in response to a count pulse 'CNTP'. In an embodiment, the counter 312 may be implemented as an N bit up/down counter.

The timing controller 313 is configured to periodically generate the latch pulse 'LATP' and the count pulse 'CNTP' for the period of a setting interval.

Figure 5:
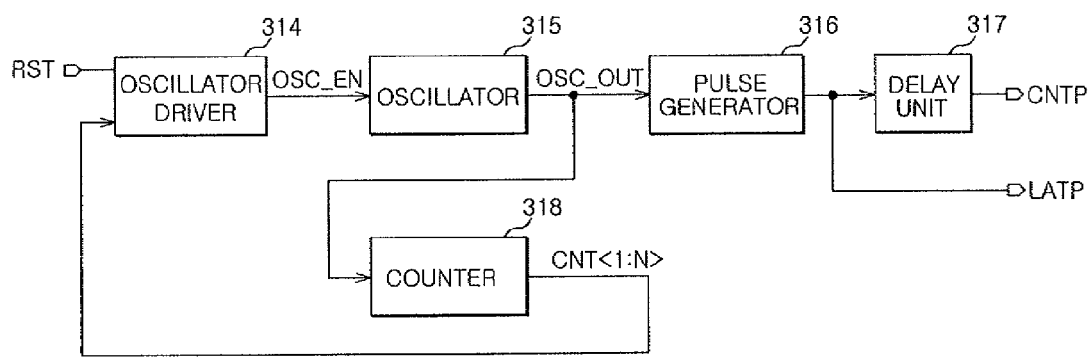
FIG. 5 is a block diagram showing a configuration of an embodiment of the timing controller of FIG. 4.
Figure 6:
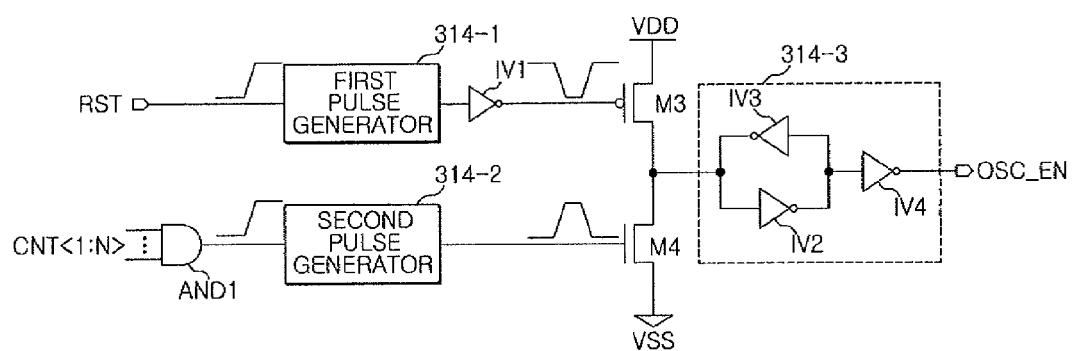
FIG. 6 is a block diagram showing a configuration of an embodiment of the oscillator driver of FIG. 5.
Figure 7:
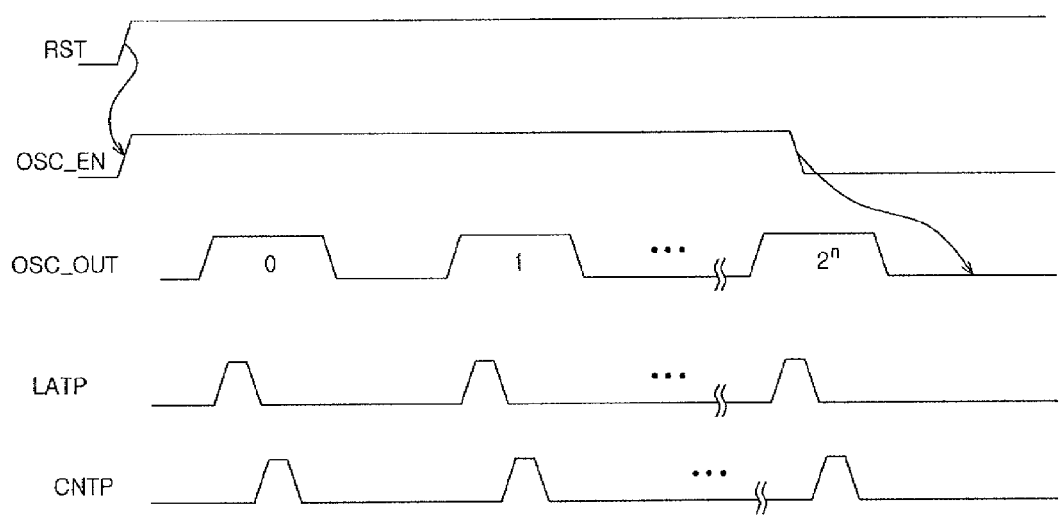
FIG. 7 is an output timing chart for illustrating operations of the timing controller of FIG. 5.

FIG. 5 is a block diagram of a configuration of an embodiment of the timing controller 313 of FIG. 4, FIG. 6 is a block diagram showing a configuration of an embodiment of the oscillator driver 314 of FIG. 5, and FIG. 7 is an output timing chart illustrating the operation of the timing controller 313 of FIG. 5.

In the embodiment shown in FIG. 5, the timing controller 313 includes an oscillator driver 314, an oscillator 315, a pulse generator 316, a delay unit 37, and a counter 318.

Referring to FIGS. 5 and 7, the oscillator driver 314 is configured to activate an oscillator enable signal 'OSC_EN' in response to the reset signal 'RST' and deactivate the oscillator enable signal 'OSC_EN' according to the count value of the count signal 'CNT<1:N>'.

As shown in FIG. 7, the oscillator 315 is configured to generate the oscillator signal 'OSC_OUT' in response to the oscillator enable signal 'OSC_EN'. In an embodiment, the oscillator 315 may be implemented as a ring oscillator.

The pulse generator 316 is configured to generate the latch pulse 'LATP' in response to the oscillator signal 'OSC_OUT' as is shown in FIG. 7.

The delay unit 317 is configured to generate the count pulse 'CNTP' by delaying the latch pulse 'LATP' for a defined time, as shown in FIG. 7.

In other words, the delay unit causes the phase of the count pulse 'CNTP' to be shifted with respect to the latch pulse 'LATP'.

The counter 318 is configured to count the rising edge of the oscillator signal 'OSC_OUT' to sequentially increase the count value of the count signal 'CNT<1:N>'. In an embodiment, the counter 318 may be implemented as an N bit binary counter.

Referring to FIG. 6, the embodiment of the oscillator driver 314 shown in FIG. 6 includes an AND gate (AND1), a first pulse generator 314-1, a second pulse generator 314-2, a latch 314-3, and a plurality of transistors M3 and M4. The latch 314-3 can be configured as a plurality of inverters 'IV2 to IV4' as shown in FIG. 6.

When the reset signal 'RST' is activated, the oscillator driver 314 drives a power supply voltage 'VDD' in response to the pulse signal generated in the first pulse generator 314-1, thereby activated the oscillator enable signal 'OSC_EN'. When the count signal 'CNT<1:N>' is at a maximum value, that is, when all bits of the count signal 'CNT<1:N>' become a high level, the transistor M4 drives a ground voltage 'VSS' in response to the pulse signal generated in the second pulse generator 314-2, thereby deactivating the oscillator enable signal 'OSC_EN'.

At this time, the oscillator signal 'OSC_OUT' generates a rising edge at a predetermined period, as is illustrated in FIG. 7. Under this operation, the time period from the time point as which the reset signal 'RST' is activated to the time point as which the count signal 'CNT<1:N>' reaches its maximum value is always constant. Therefore, the activation interval of the oscillator enable signal 'OSC_EN' may always be constant.

Figure 8:
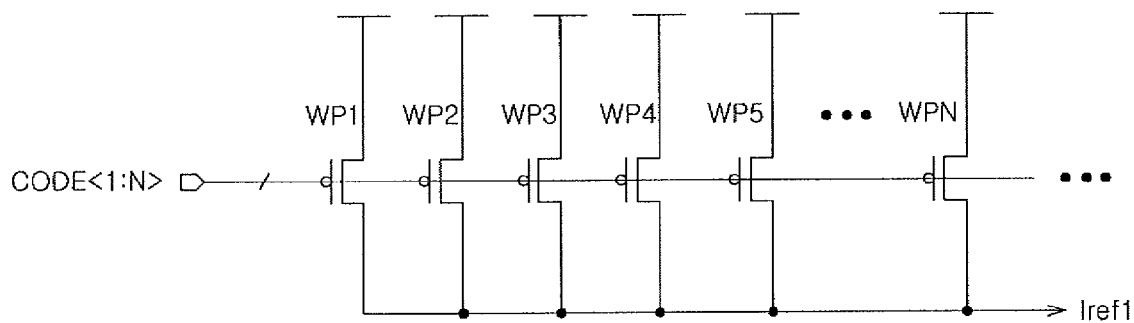
FIG. 8 is a circuit diagram showing a configuration of an embodiment of the digital driver of FIG. 3.

FIG. 8 is a circuit diagram showing the configuration of an embodiment of the digital driver 320 of FIG. 3.

In the embodiment shown in FIG. 8, the digital driver 320 includes a plurality of transistors 'WP1 to WPN' whose sources are applied with the power supply voltage 'VDD', whose gates are applied with the digital code 'CODE<1:N>' bit by bit (i.e., each gate is provided with a one of the bits of the digital code 'CODE<1:N>'), and whose drains are commonly connected.

In the symbols of the plurality of transistor 'WP1 to WPN', W means a width of the gate electrode and P means that a transistor is a P-type transistor.

The plurality of transistors 'WP1 to WPN' can be designed to have different gate electrode widths or the same gate electrode widths in order to meet a scheme of increasing/decreasing the code value of the digital code 'CODE<1:N>'.

In other words, when increasing or decreasing the code value of the digital code 'CODE<1:N>' is performed by shifting a code bit having a logic value '0', the plurality of transistors 'WP1 to WPN' is configured such that widths of the gate electrodes increase by a predetermined ratio. In this case, the respective transistors 'WP1 to WPN' have different current driving amounts.

Meanwhile, when increasing/decreasing the code value of the digital code 'CODE<1:N>' is performed by changing the number of code bits that have a logic value of '0', the widths of the gate electrodes of the respective transistors 'WP1 to WPN' can be different or the same.

In each case, the amount of the current 'Iref1' can be controlled by selectively operating the transistors 'WP1 to WPN' of the digital driver 320 such that the code value of the digital code 'CODE<1:N>' is increased or decreased.

The operation in which the code generating block 300 generates the code will be described with reference to FIG. 3. The internal operation of the code controller 310 and the digital driver 320 shown in FIG. 3 is described with reference to FIGS. 4 to 8.

The comparator 330 compares the code conversion voltage 'VREFi' to the first reference voltage 'VREF1'. The level of the code conversion voltage corresponds to the amount of the current 'Iref1' output by the digital driver 320. At this time, the digital code 'CODE<1:N>' is at an initial value, and thus the comparison signal 'CMP_OUT' output by the comparator 330 is a result of comparing the first reference voltage 'VREF1' to a code conversion voltage VREFi obtained from the initial value of the digital code 'CODE<1:N>'.

If the level of the code conversion voltage 'VREFi' is either higher or lower than the first reference voltage 'VREF1', the digital code 'CODE<1:N> is adjusted so that the current amount 'Iref1' is correspondingly increased or decreased to lower or raise the level of the code conversion voltage 'VREFi'. In an embodiment, the digital code should be adjusted so as to cause the code conversion voltage VREFi to be nearly the same as the first reference voltage VREF1. The code controller 310 and the digital driver 320 are designed to meet the above operational principle.

The code controller 310 increases or decreases the code value of the digital code 'CODE<1:N>' according to the comparison signal 'CMP_OUT'.

If the level of the code conversion voltage is higher than that of the first reference voltage REF1, the digital code 'CODE<1:N> is adjusted so as to cause the digital driver 320 to reduce the amount of current 'Iref1'.

As the current amount 'Iref1' is decreased, the level of the code conversion voltage 'VREFi' also decreases.

The above-mentioned comparison and the corresponding control of the code value of the digital code 'CODE<1:N>' are repeated, and the level of the code conversion voltage 'VREFi' and the first reference voltage 'VREF1' meet each other within a predetermined tolerance. At this time, the code value of the digital code 'CODE<1:N>' will repeat the increase or decrease, because the level of the code conversion voltage 'VREFi' and the first reference voltage 'VREF1' cannot ideally meet each other.

The control operation of the code value of the above-mentioned comparison and the corresponding digital code 'CODE<1:N>' is made for the setting time period, that is, the activation interval of the oscillator enable signal 'OSC_EN', as described in the description of FIG. 7. After the oscillator enable signal 'OSC_EN" is deactivated, the digital code 'CODE<1:N>' is maintained at the finally controlled code value during the activation interval of the oscillator enable signal 'OSC_EN'.

Figure 9:
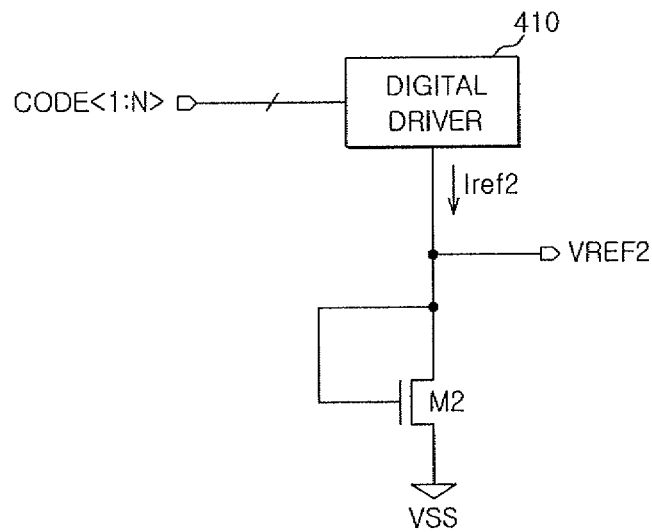
FIG. 9 is a block diagram showing a configuration of an embodiment of the voltage conversion block of FIG. 2.

FIG. 9 is a block diagram showing a configuration of an embodiment of the voltage conversion block 400 of FIG. 2.

In the embodiment shown in FIG. 9, the voltage conversion block 400 includes a digital driver 410 and a transistor 'M2'.

The digital driver 410 is configured to control the amount of current 'Iref2' flowing to the transistor 'M2' according to the digital code 'CODE<1:N>'. The transistor 'M2' is used as a potential difference generating element.

The drain of the transistor 'M2' is connected to its gate and the digital driver 410, and the source thereof is connected to a ground terminal 'VSS'. The voltage level of the second reference voltage 'VREF2' corresponds to the amount of current 'Iref2' and is generated between the source and the drain of the transistor 'M2'.

Using the digital code 'CODE<1:N>', the second reference voltage 'VREF2' generated by the voltage conversion block 400 has a voltage level that is substantially the same as that of the first reference voltage 'VREF1'. This second reference voltage 'VREF2' is transmitted to the circuit blocks 500-1 to 500-N. There may be, of course, a slight difference in the voltage level of the first reference voltage 'VREF1' and the second reference voltage 'VREF2'. However, this difference would be within the tolerance at the time of designing the circuit; and in the following description, it is considered that the first reference voltage 'VREF1' and the second reference voltage 'VREF2' are the same. The tolerance increases resolution, that is, the number of bits of the digital code 'CODE<1:N>' and can be minimized by designing the digital drivers 320 and 410 to meet the desired tolerance.

At this time, in order for the second reference voltage 'VREF2', which is derived from the digital code 'CODE<1:N>', to have the same level as the first reference voltage 'VREF1', an accurate conversion should be made when converting the digital code 'CODE<1:N>' into the second reference voltage 'VREF2'.

Therefore, in an embodiment, the digital driver 410 is configured to be the same as the digital driver 320 of FIG. 8, and the transistor 'M2' is also configured to be the same as the transistor 'M1' of the code generating block 300 shown in FIG. 3.

As shown in FIG. 9, a short is formed between the gate and the drain of the transistor 'M2'. Referring to FIG. 3, the gate of transistor 'M1' is not short-circuited to the drain. The code generating block 300 shown in FIG. 3 controls the digital code 'CODE<1:N>' so that the level of the first reference voltage 'VREF1' and the code conversion voltage 'VREFi' are the same as each other. When the first reference voltage 'VREF1' and the code conversion voltage 'VREFi' have the same level, the gate and drain of the transistor 'M1' are in a virtual short state.

The voltage conversion block 400 generates the second reference voltage 'VREF2' according to the digital code 'CODE<1:N>' that is controlled to make the gate and drain of the transistor 'M1' shown in FIG. 3 the virtual short state.

Therefore, the voltage conversion block 400 can generate the second reference voltage 'VREF2' at the same level as the first reference voltage 'VREF1'.

Figure 10:
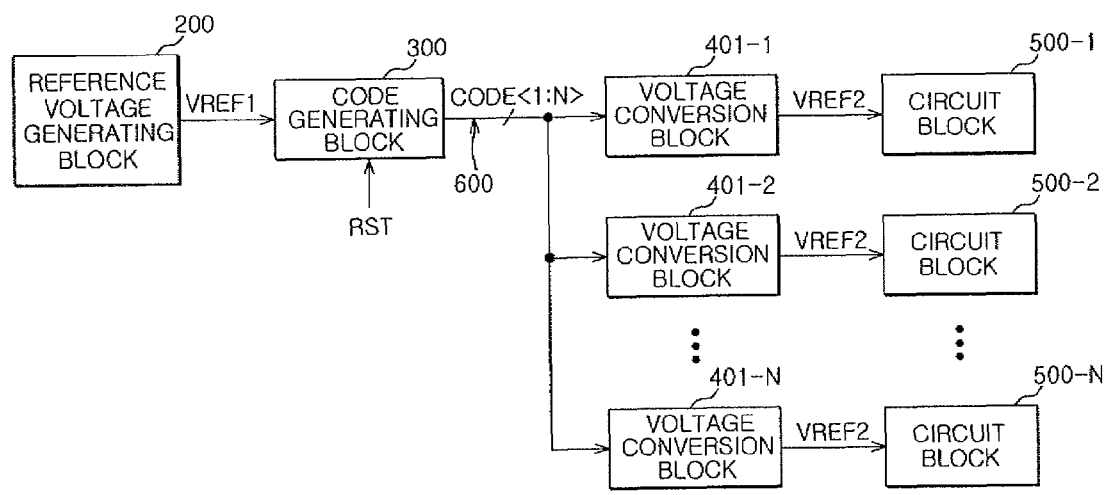
FIG. 10 is a block diagram of a semiconductor integrated circuit according to another embodiment.

FIG. 10 is a block diagram of a semiconductor integrated circuit 101 according to another embodiment of the present invention.

In the embodiment shown in FIG. 10, the semiconductor integrated circuit 101 includes a reference voltage generating block 200, a code generating block 300, a plurality of voltage conversion blocks 401-1 to 401-N, a transmission line 600, and a plurality of circuit blocks 500-1 to 500-N.

The embodiment shown in FIG. 10 may be configured to be same as the semiconductor integrated circuit illustrated in FIGS. 2 to 9, except that FIG. 10 includes the plurality of voltage conversion blocks 401-1 to 401-N. The basic circuit configuration of the plurality of voltage conversion blocks 401-1 to 401-N can be implemented to be the same as the voltage conversion block 400 of FIG. 2.

When the plurality of circuit blocks 500-1 to 500-N are disposed adjacently to each other, the second reference voltage 'VREF2' generated in one voltage conversion block 400 can be provided to all circuit blocks 500-1 to 500-N at the same level as in the embodiment, as shown in FIG. 2.

However, when the plurality of circuit blocks 500-1 to 500-N are disposed away from each other by a predetermined distance, the second reference voltage 'VREF2' generated in one voltage conversion block (for example, 401-1) cannot be provided to all circuit blocks 500-1 to 500-N at the same level.

Therefore, in the embodiment shown in FIG. 10 configures the plurality of voltage conversion blocks 401-1 to 401-N to correspond to the plurality of circuit blocks 500-1 to 500-N respectively, thereby improving the uniformity of the second reference voltage 'VREF2' provided to the plurality of circuit blocks 500-1 to 500-N.

Each of the plurality of voltage conversion blocks 401-1 to 401-N can use the configuration shown in FIG. 9. Each of the plurality of voltage conversion blocks 401-1 to 401-N can be disposed in a very small circuit area when considering the entire area of the semiconductor integrated circuit as a simple circuit configuration as can be appreciated from FIG. 9. Therefore, the circuit area or the design burden due to the configuration of the plurality of voltage conversion blocks 401-1 to 401-N is not substantially increased.

Figure 11:
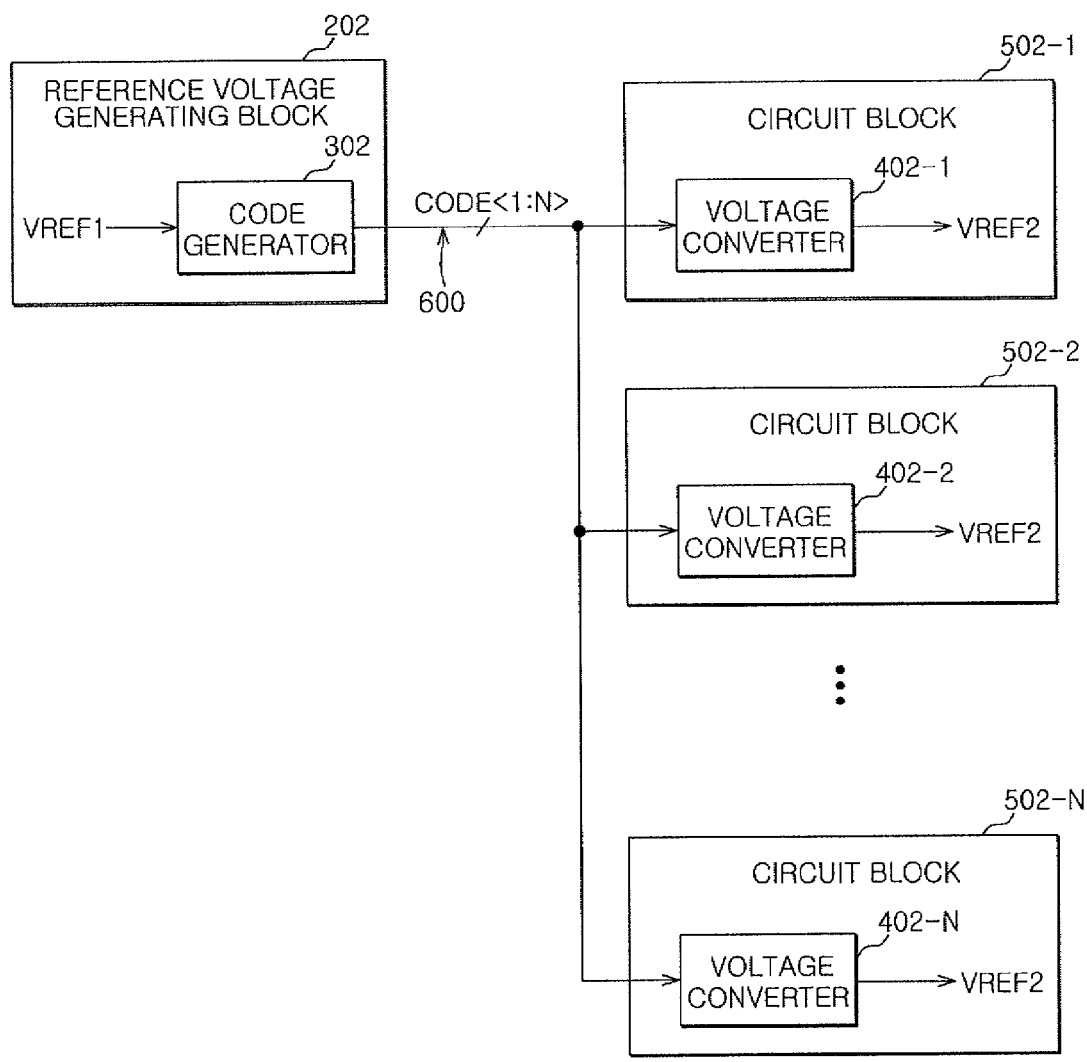
FIG. 11 is a block diagram of a semiconductor integrated circuit according to another embodiment.

FIG. 11 is a block diagram of a semiconductor integrated circuit 102 according to another embodiment.

In the embodiment shown in FIG. 11, the semiconductor integrated circuit 102 is configured so that the reference voltage generating block 202 itself can convert the first reference voltage 'VREF1' into the digital code 'CODE<1:N>' and transmit it to the plurality of circuit blocks 502-1 to 502-N through the transmission line 600, and each of the plurality of circuit blocks 502-1 to 502-N can convert the digital code 'CODE<1:N>' into the second reference voltage 'VREF2' and use it.

The code generator 302 for performing the digital code 'CODE<1:N>' generating function is configured in the reference voltage generating block 202 and the plurality of voltage converters 402-1 to 402-N for performing a function of converting the digital code 'CODE<1:N>' into the second reference voltage 'VREF2' is configured inside each of the plurality of circuit blocks 502-1 to 502-N.

An embodiment of the reference voltage generating block 202, which is a configuration for generating the first reference voltage 'VREF1', may include a band gap reference circuit and may generate the first reference voltage 'VREF1' at a predetermined level using the band gap reference circuit regardless of fluctuation in process/voltage/temperature (PVT).

The circuit configuration of the code generator 302 and the plurality of voltage converters 402-1 to 402-N can be implemented to be the same as shown in FIGS. 2 to 9.

The plurality of circuit blocks 502-1 to 502-N includes their own inherent functions using the second reference voltage 'VREF2', that is, the respective circuit blocks 502-1 to 502-N are a functional block for performing a function that is related to the operation of the semiconductor integrated circuit. For example, the circuit block 502-1 may include the functional block that performs a delay fixed loop operation.

The reference voltage generating block 202 and the plurality of circuit blocks 502-1 to 502-N can be allocated with each of the independent circuit areas in consideration of the design of a layout margin, a signal line disposition, etc.

The code generator 302 may be configured in a margin area in the circuit area allocated for the reference voltage generating block 202 and the plurality of voltage converters 402-1 to 402-N may be configured in the margin area in the circuit area allocated for each of the plurality of circuit blocks 502-1 to 502-N.

Meanwhile, a case may exist in which one or more of the plurality of circuit blocks 502-1 to 502-N, for example, the circuit block 502-1 cannot have the voltage converter 402-1 therein due to the lack of a margin area or an internal signal line wiring, etc. In this case, it is possible to form the voltage converter 402-1 in an area adjacent to the circuit block 502-1. Even the code generator 302 case, it can be formed outside the reference voltage generating block 202 as described above.

As described above, when the code generator 302 is configured in the margin area of the reference voltage generating block 202 and the voltage converters 402-1 to 402-N are configured in the margin areas of the plurality of circuit blocks 502-1 to 502-N, the layout margin can maximally be secured while including the stable reference transmission function in terms of the semiconductor integrated circuit. In addition, the number of transmission lines for transmitting the first reference voltage 'VREF1" and the second reference voltage 'VREF2' can be further reduced as compared to the embodiments shown in FIGS. 2 and 10 and therefore, the noise due to the transmission line can be further reduced.

While certain embodiments have been described above, it will be understood to those skilled in the art that the embodiments described are by way of example only. Accordingly, the apparatus described herein should not be limited based on the described embodiments. Rather, the scope of the present invention is defined only by claims. All modifications and changes derived from the meanings, scope, and equivalents of claims should be construed as being included in the scope of the present invention.

What is claimed is:

1. A semiconductor integrated circuit, comprising:
   a reference voltage generating block configured to generate a first reference voltage defining a reference for an operation related to the function of the semiconductor integrated circuit;
   a code generating block configured to generate and output a digital code corresponding to the voltage level of the first reference voltage;
   a circuit block configured to convert the digital code into a second reference voltage and use the second reference voltage for the operation; and
   a transmission line connected between the reference voltage generating block and the circuit block to transmit the digital code,
   wherein the code generating block comprises:
   a digital driver configured to generate a reference current, wherein an amount of the reference current is dependent upon the digital code;
   a potential difference generating element configured to generate a code conversion voltage in proportion to the amount of the reference current; and
   a comparator configured to generate a comparison signal by comparing the code conversion voltage with the first reference voltage,
   wherein the potential difference generating element is a transistor having a drain connected to the digital driver, a source connected to a ground terminal, and a gate.

2. The semiconductor integrated circuit of claim 1, wherein the code generating block is further configured to adjust the code value of the digital code according to a result obtained by comparing a code conversion voltage derived from the digital code with the first reference voltage.

3. The semiconductor integrated circuit of claim 1, wherein the code generating block is further configured to generate, for a defined period of a setting interval, a plurality of comparison results which are generated by comparing a code conversion voltage derived from the digital code with the first reference voltage, and configured to adjust the code value of the digital code in response to each of the comparison results such that the level of the code conversion voltage is substantially the same as the level of the first reference voltage.

4. The semiconductor integrated circuit of claim 1, wherein the digital driver comprises a plurality of transistors, the plurality of transistors being selectively operated according to the digital code to generate the reference current.

5. The semiconductor integrated circuit of claim 1, wherein the code generating block further comprises a code controller configured to periodically generate a count pulse for a period of a setting interval defined using a reset signal, and configured to perform increasing and decreasing operations on the code value of the digital code, wherein the code value is either increased or decreased according to the comparison signal in response to the count pulse.

6. The semiconductor integrated circuit of claim 5, wherein the code controller comprises:
   a latch configured to latch the comparison signal in response to a latch pulse;
   a counter configured to increase or decrease the code value of the digital code in response to the count pulse; and
   a timing controller configured to periodically generate the latch pulse and the count pulse during the period of the setting interval.

7. The semiconductor integrated circuit of claim 6, wherein the timing controller comprises:
   an oscillator driver configured to generate an oscillator enable signal enabled during the period of the setting interval in response to the reset signal and a count signal;
   an oscillator configured to generate an oscillator signal in response to the oscillator enable signal;
   a pulse generator configured to generate the latch pulse in response to the oscillator signal;
   a delay unit configured to delay the latch pulse for a defined time and outputting the delayed latch pulse as the count pulse; and a counter configured to count a number of pulses of the oscillator signal so as to generate the count signal.

8. The semiconductor integrated circuit of claim 7, wherein the oscillator driver is configured to activate the oscillator enable signal when the reset signal is activated and to deactivate the oscillator enable signal when a count value of the count signal reaches a predetermined maximum value.

9. The semiconductor integrated circuit of claim 1, wherein the circuit block comprises:
   a digital driver configured to control an amount of a reference current according to the digital code;
   a potential difference generating element configured to generate the second reference voltage in proportion to the amount of the reference current; and
   a functional block configured to perform the operation related to the function of the semiconductor integrated circuit using the second reference voltage.

10. The semiconductor integrated circuit of claim 9, wherein the digital driver comprises a plurality of transistors, the plurality of transistors being selectively operated according to the digital code so as to output the reference current.

11. A semiconductor integrated circuit, comprising:
   a code generating block receiving a first reference voltage defining a reference for an operation related to the function of the semiconductor integrated circuit, the code generating block being configured to generate a digital code corresponding to the voltage level of the first reference voltage;
   a voltage conversion block configured to convert the digital code into a second reference voltage and providing the second reference voltage to the circuit block, the circuit block being configured to use the second reference voltage for the operation; and
   a transmission line connected between the code generating block and the voltage conversion block to transmit the digital code,
   wherein the code generating block comprises:
   a digital driver configured to generate a reference current, wherein an amount of the reference current generated is dependent upon the digital code;
   a potential difference generating element configured to generate a code conversion voltage in proportion to the amount of the reference current;
   a comparator configured to generate a comparison signal by comparing the code conversion voltage with the first reference voltage; and a code controller configured to adjust the digital code according to the comparison signal,
   wherein the code controller comprises:
   a latch configured to latch the comparison signal in response to a latch pulse;
   a counter configured to increase or decrease the code value of the digital code in response to a count pulse; and
   a timing controller configured to periodically generate the latch pulse and the count pulse during a period of a setting interval,
   wherein the timing controller comprises:
   an oscillator driver configured to generate an oscillator enable signal enabled during the period of the setting interval in response to the reset signal and a count signal;
   an oscillator configured to generate an oscillator signal in response to the oscillator enable signal;
   a pulse generator configured to generate the latch pulse in response to the oscillator signal;
   a delay unit configured to delay the latch pulse for a defined time and outputting the delayed latch pulse as the count pulse; and
   a counter configured to count a number of pulses of the oscillator signal so as to generate the count signal.

12. The semiconductor integrated circuit of claim 11, wherein the digital driver comprises a plurality of transistors, the plurality of transistors being selectively operated according to the digital code to generate the reference current.

13. The semiconductor integrated circuit according to claim 11, wherein the voltage conversion block comprises:
   a digital driver configured to control an amount of a reference current according to the digital code;
   a potential difference generating element configured to generate the second reference voltage in proportion to the amount of the reference current.

14. The semiconductor integrated circuit according to claim 11, further comprising a reference voltage generating block disposed adjacent to the code generating block, wherein the reference voltage generating block generates the first reference voltage.

15. The semiconductor integrated circuit according to claim 11, wherein a plurality of the voltage conversion blocks are formed, and each voltage conversion block provides the second reference voltage to one of a plurality of the circuit blocks performing a plurality of different operations related to the function of the semiconductor integrated circuit.

* * * * *